(12) United States Patent
Lee et al.

(10) Patent No.: US 10,612,744 B2
(45) Date of Patent: Apr. 7, 2020

(54) VEHICLE LAMP USING SEMICONDUCTOR LIGHT EMITTING DEVICE

(71) Applicant: LG ELECTRONICS INC., Seoul (KR)

(72) Inventors: Sungwhan Lee, Seoul (KR); Hooyoung Song, Seoul (KR); Kyungho Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/028,018

(22) Filed: Jul. 5, 2018

(65) Prior Publication Data
US 2019/0219244 A1 Jul. 18, 2019

(30) Foreign Application Priority Data

Jan. 16, 2018 (KR) ........................ 10-2018-0005732

(51) Int. Cl.

| | |
|---|---|
| *H01L 33/36* | (2010.01) |
| *H01L 33/32* | (2010.01) |
| *F21S 43/14* | (2018.01) |
| *H01L 33/10* | (2010.01) |
| *H01L 33/62* | (2010.01) |
| *H01L 33/44* | (2010.01) |
| *F21S 43/15* | (2018.01) |
| *F21S 43/19* | (2018.01) |
| *F21Y 115/10* | (2016.01) |
| *H01L 33/60* | (2010.01) |
| *H01L 25/075* | (2006.01) |

(52) U.S. Cl.
CPC ............... *F21S 43/14* (2018.01); *F21S 43/15* (2018.01); *F21S 43/195* (2018.01); *H01L 33/10* (2013.01); *H01L 33/36* (2013.01); *H01L 33/44* (2013.01); *H01L 33/62* (2013.01); *F21Y 2115/10* (2016.08); *H01L 25/0753* (2013.01); *H01L 33/60* (2013.01)

(58) Field of Classification Search
CPC .......... F21S 43/14; H01L 33/36; H01L 33/62; H01L 33/10; F21Y 2115/10
See application file for complete search history.

(56) References Cited

U.S. PATENT DOCUMENTS

| | | | | |
|---|---|---|---|---|
| 9,837,388 | B2 * | 12/2017 | Rhee | ............... H01L 25/0753 |
| 10,121,940 | B1 * | 11/2018 | Lee | ............... H01L 33/46 |
| 2016/0351755 | A1 * | 12/2016 | Lee | ............... H01L 33/56 |
| 2017/0040492 | A1 * | 2/2017 | Chiu | ............... H01L 33/30 |

(Continued)

*Primary Examiner* — Tracie Y Green
(74) *Attorney, Agent, or Firm* — Birch, Stewart, Kolasch & Birch, LLP

(57) ABSTRACT

The present invention relates to a vehicle lamp using a semiconductor light emitting device, and the vehicle lamp includes a light source unit to emit light. The light source unit includes a substrate having a reflective film, a semiconductor light emitting device coupled to the substrate, an insulating layer stacked on the reflective film to surround the semiconductor light emitting device, a first electrode and a second electrode disposed on an upper surface of the insulating layer, and light-transmitting connection electrodes extending from the first and second electrodes, respectively, electrically connected to the semiconductor light-emitting device, and covering an upper surface of the semiconductor light-emitting device.

9 Claims, 11 Drawing Sheets

(56) References Cited

U.S. PATENT DOCUMENTS

2017/0125641 A1\* 5/2017 Jeon .................. H01L 33/382
2017/0345802 A1\* 11/2017 Sung ................. H01L 25/0753
2018/0313513 A1\* 11/2018 Park .................. H01L 33/62
2019/0203896 A1\* 7/2019 Jo .................... H01L 25/0753

\* cited by examiner

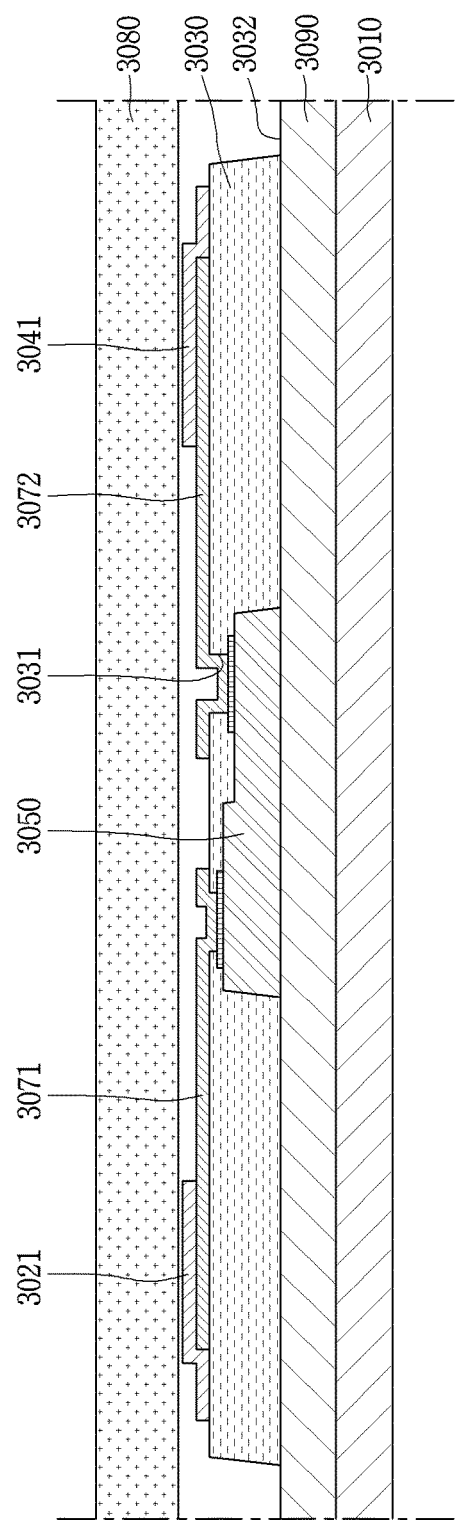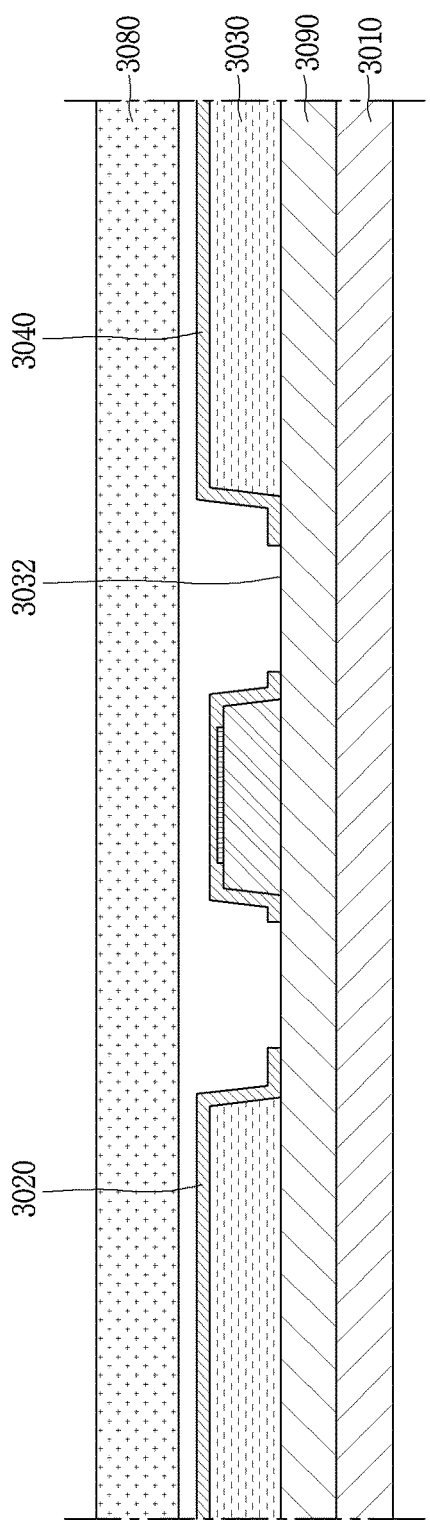

VEHICLE LAMP USING SEMICONDUCTOR LIGHT EMITTING DEVICE

CROSS-REFERENCE TO RELATED APPLICATION

Pursuant to 35 U.S.C. § 119(a), this application claims the benefit of earlier filing date and right of priority to Korean Application No. 10-2018-0005732, filed on Jan. 16, 2018, the contents of which is incorporated by reference herein in its entirety.

BACKGROUND OF THE INVENTION

1. Field of the Invention

The present invention relates to a vehicle lamp (or car lamp), and more particularly, a vehicle lamp using a semiconductor light emitting device.

2. Description of the Related Art

A vehicle is equipped with various lamps having lighting functions and signaling functions. In general, halogen lamps or gas discharge lamps are usually used, but in recent years, light emitting diodes (LEDs) are in the spotlight as light sources for vehicle lamps.

The LED can enhance a degree of freedom for design of a lamp by minimizing a size thereof and exhibit economic efficiency by virtue of a semi-permanent lifespan, but most of the LEDs are currently produced in a form of a package. The LED itself other than the package is under development as a semiconductor light emitting device of converting a current into light, namely, an image displaying light source equipped in an electronic device such as an information communication device.

Vehicle lamps ever developed use LEDs in a package form and thereby have disadvantages, such as a low mass production yield rate, high fabrication costs and low flexibility. Therefore, in recent years, there has been an attempt to fabricate a vehicle lamp using semiconductor light emitting devices themselves rather than such package form.

However, brightness may be lowered due to an optical loss of the semiconductor light emitting devices. Accordingly, the present invention proposes a vehicle lamp using semiconductor light emitting devices that are capable of increasing brightness by use of a novel structure. On the other hand, the semiconductor light emitting devices may be arranged in series and in parallel, and this may change peripheral resistance of each semiconductor light emitting device. This results in reducing overall uniformity of a light source, and thus a structure that can solve this problem is also needed.

SUMMARY OF THE INVENTION

One object of the present invention is to realize a vehicle lamp that reduces an optical loss of a semiconductor light emitting device.

Another object of the present invention is to realize a vehicle lamp that emits light with uniform brightness regardless of a position.

In order to achieve the objects of the present invention, a vehicle lamp according to the present invention may ensure brightness of a light source by stacking components in sequence of reflective film/semiconductor light emitting device/insulating layer/wiring. Further, an exposure groove may be formed in the insulating layer to improve reflection efficiency, thereby increasing the brightness of the light source.

In detail, a vehicle lamp according to the present invention may be provided with a light source unit to emit light. The light source unit may include a substrate having a reflective film, a semiconductor light emitting device coupled to the substrate, an insulating layer stacked on the reflective film to surround the semiconductor light emitting device, a first electrode and a second electrode disposed on an upper surface of the insulating layer, and light-transmitting connection electrodes extending from the first and second electrodes, respectively, electrically connected to the semiconductor light-emitting device, and covering an upper surface of the semiconductor light-emitting device.

In an embodiment of the present invention, the insulating layer may cover the semiconductor light emitting device. The insulating layer may be provided with an open hole formed therethrough to expose the upper surface of the semiconductor light emitting device, and the light-transmitting connection electrodes may extend to the upper surface of the semiconductor light emitting device through the open hole.

A first conductive electrode and a second conductive electrode may be disposed on a first conductive semiconductor layer and a second conductive semiconductor layer of the semiconductor light emitting device, respectively, and the light-transmitting connection electrodes may be electrically connected to the first conductive electrode and the second conductive electrode through the open hole.

In an embodiment, the insulating layer may be provided with an exposure groove to expose the reflective film therethrough. The exposure groove may extend in a direction parallel to the first and second electrodes. The exposure groove may be provided with a first portion formed between the first electrode and the second electrode, and a second portion protruding from the first portion and extending between the semiconductor light emitting device and one of the first electrode and the second electrode.

At least one of the first electrode and the second electrode may be disposed to cover a side wall of the exposure groove. At least one of the first electrode and the second electrode may extend from the side wall of the exposure groove to the upper surface of the reflective film.

The insulating layer may further be provided with a plurality of through holes penetrating therethrough up to the reflective film. The light-transmitting connection electrodes may be inserted into the plurality of through holes. The plurality of through holes may be sequentially disposed along a direction intersecting with the first electrode and the second electrode.

In an embodiment, the first electrode and the second electrode may be formed to be parallel to each other, and the semiconductor light emitting device may be disposed between the first electrode and the second electrode. The light-transmitting connection electrodes may protrude from the first electrode and the second electrode in opposite directions to each other.

Meanwhile, in order to achieve the aspects of the present invention, a vehicle lamp according to the present invention adjusts a resistance value by varying lengths of connection electrodes according to a position of a semiconductor light emitting device.

In an embodiment, the first electrode and the second electrode may respectively have a first protrusion and a second protrusion protruding in opposite directions to each other, and the light-transmitting connection electrodes may connect the first protrusion and the second protrusion to the semiconductor light emitting device, respectively.

The semiconductor light emitting device may be disposed between the first protrusion and the second protrusion. The light-transmitting connection electrodes may extend from the first protrusion and the second protrusion toward the semiconductor light emitting device, and may be disposed in parallel to the first electrode and the second electrode.

In an embodiment, the semiconductor light emitting device may be any one of a plurality of semiconductor light emitting devices disposed at preset intervals along a direction parallel to the first electrode. The light-transmitting connection electrodes may have different lengths depending on positions of the plurality of semiconductor light emitting devices.

In a vehicle lamp according to the present invention, a vehicle lamp with a point light source having high brightness owing to a new type of stacking structure is implemented.

Further, in the present invention, since an insulating layer has a structure of opening a lateral direction of a semiconductor light emitting device, brightness can be more increased.

Further, in the present invention, in order to reduce light absorption by a metal wiring, a light extraction pattern is provided on a light-transmitting connection electrode, thereby increasing brightness.

In addition, in the present invention, a resistance value of an individual chip end can be optimized through a structure in which a length of the light-transmitting connection electrode can be adjusted.

BRIEF DESCRIPTION OF THE DRAWINGS

FIGS. 6B and 6C are sectional views taken along the lines F-F and G-G of FIG. 6A.

DETAILED DESCRIPTION OF THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present invention is not limited by the accompanying drawings.

It will be understood that when an element such as a layer, area or substrate is referred to as being "on" another element, it can be directly on the element, or one or more intervening elements may also be present.

A vehicle lamp described in this specification may include a head lamp, a tail lamp, a position lamp, a fog lamp, a turn signal lamp, a brake lamp, an emergency lamp, a backup lamp, and the like. However, it will be readily apparent to those skilled in the art that the configuration according to the embodiments described herein may also be applied to a new product type that will be developed later if the device is a device capable of emitting light.

Figure 1A:
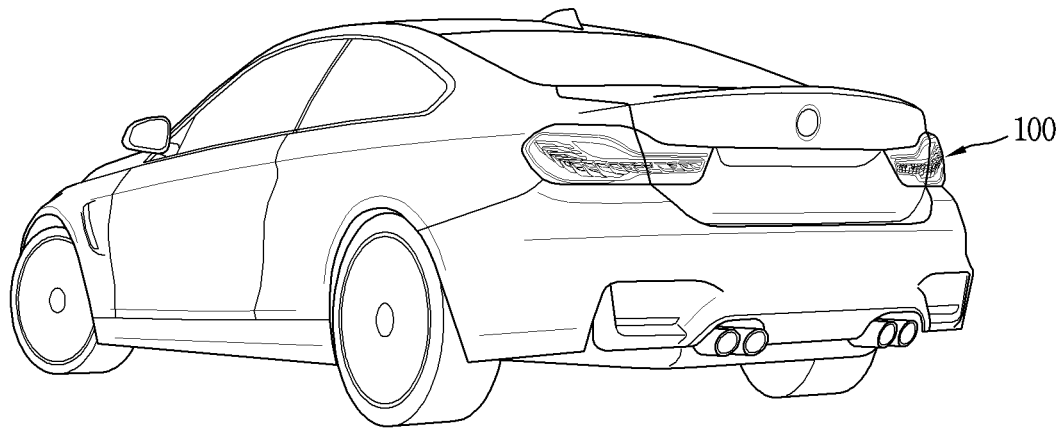
FIG. 1A is a conceptual view illustrating a rear lamp as one embodiment of a vehicle lamp.
Figure 1B:
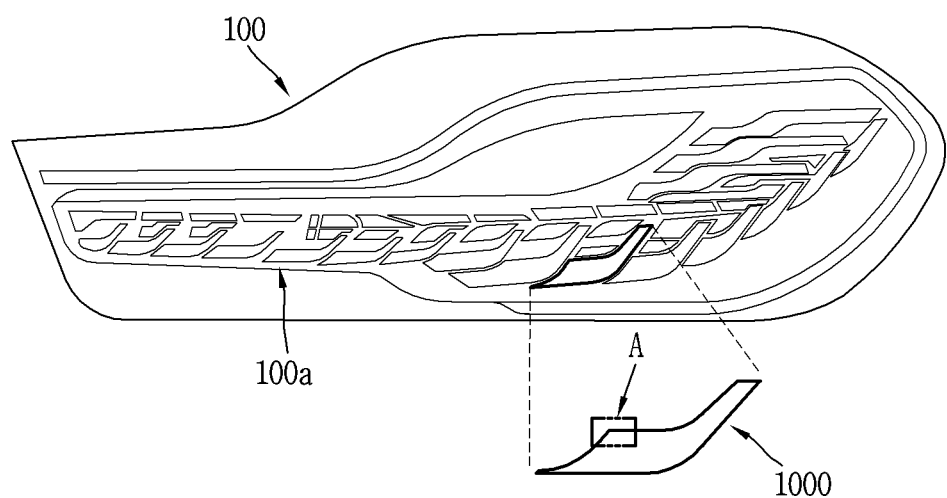
FIG. 1B is an enlarged view illustrating a state in which the rear lamp of FIG. 1A emits light.

FIG. 1A is a conceptual view illustrating a rear lamp as one embodiment of a vehicle lamp, and FIG. 1B is an enlarged view illustrating a state in which the rear lamp of FIG. 1A emits light.

Referring to FIG. 1A, rear lamps 100 of a vehicle are disposed on both sides of a rear surface of the vehicle so as to define appearance of the rear surface of the vehicle.

The rear lamp 100 may be a lamp in which a tail lamp, a turn signal lamp, a brake lamp, an emergency lamp, and the like are combined in a package form. That is, the rear lamp 100 includes a plurality of lamps selectively emitting light according to the control of the vehicle.

In this case, at least one of the plurality of lamps may be configured to emit light in a preset shape. As one example, a brake lamp 100a may be formed long in a horizontal direction and curved at at least part thereof in a vertical direction, so as to emit light in a shape corresponding to a shape of the brake lamp 100a. Furthermore, the brake lamp may be bent toward the front of the vehicle. Such complex 3D shape may be realized by a plurality of light emitting regions.

Referring to FIG. 1B, light emitting regions having different shapes are combined to realize the preset shape.

In each of the light emitting regions, a light source unit 1000 that is implemented by a semiconductor light emitting device may be disposed. The light source unit 1000 may be fixed to a vehicle body by a frame, and a wiring line for supplying power to the light source unit 1000 may be connected to the frame.

The light source unit 1000 may be a flexible light source unit that can be curved, bent, twisted, folded, or rolled by external force. The light source unit may be implemented as a planar light source having a light emitting surface corresponding to the light emitting region.

In this case, the light source unit 1000 may be provided in plurality which are arranged in the respective light emitting regions, or one light source unit may be formed to realize the entire shape.

A pixel of the light source unit 1000 may be implemented by a semiconductor light emitting device. The present invention exemplarily illustrates a light emitting diode (LED) as a type of semiconductor light emitting device for converting current into light. The LED may be a light emitting device having a size ranging from several to several tens of micrometers, and thus serve as pixels even in the 3D space.

Hereinafter, the light source unit implemented using the LED will be described in more detail.

Figure 2A:
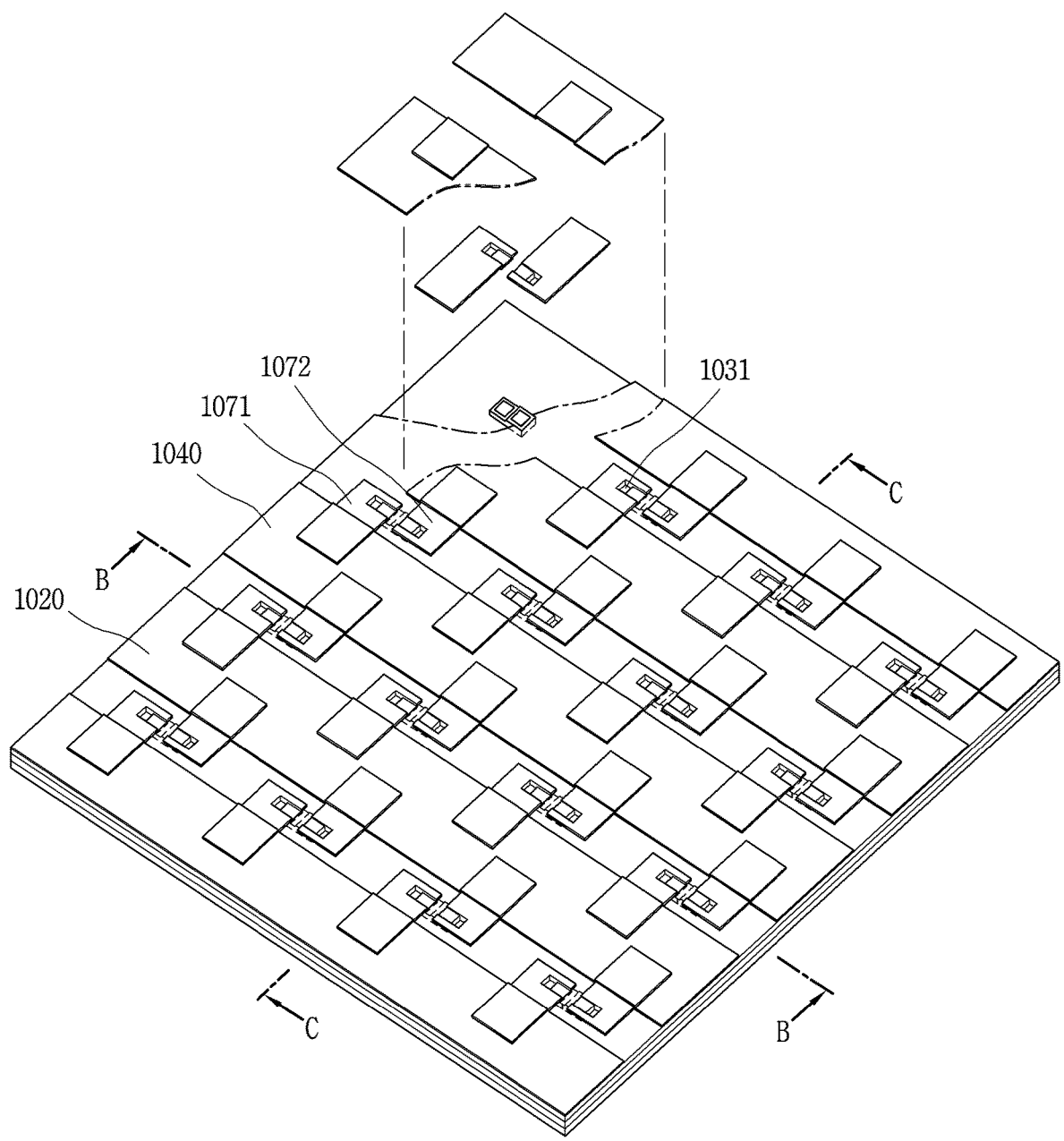
FIGS. 2A and 2B are a partial enlarged view and a planar view of an area A of FIG. 1B.
Figure 2B:
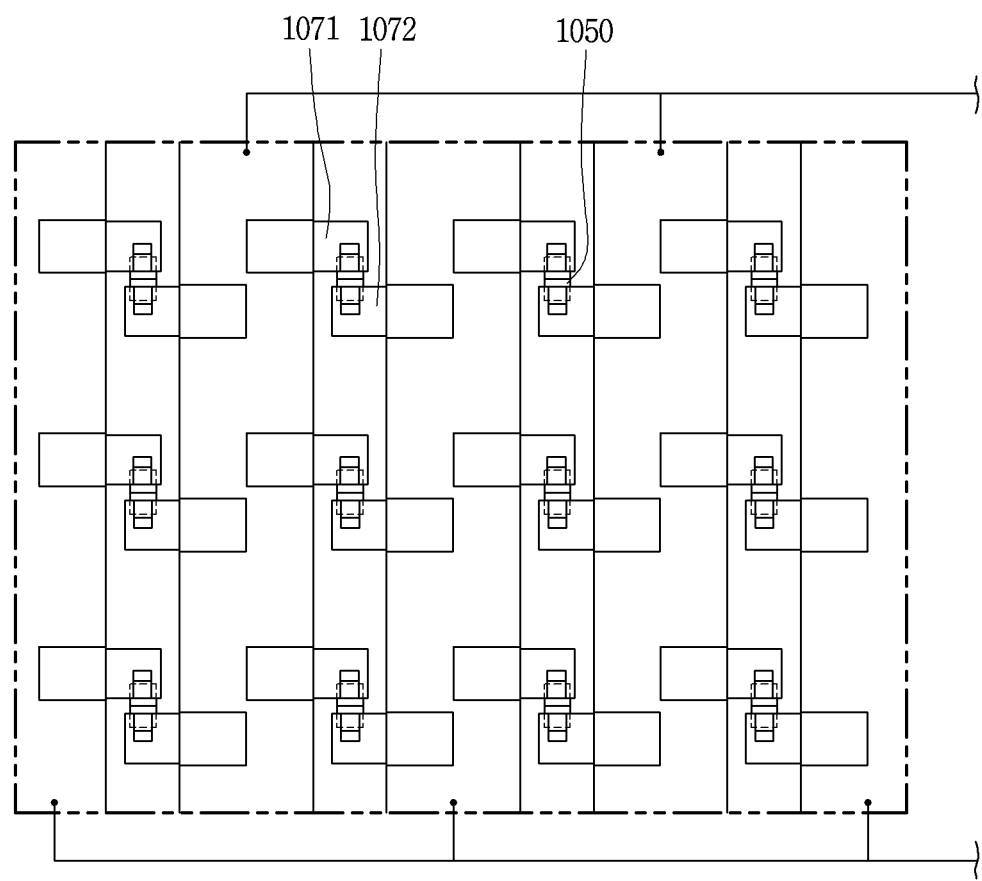
Figure 3A:
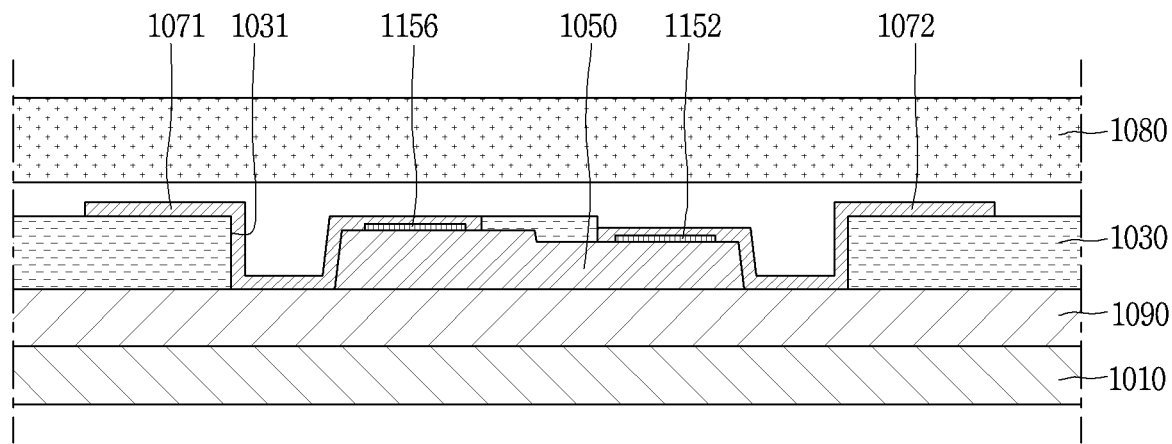
FIGS. 3A and 3B are sectional views taken along the lines B-B and C-C of FIG. 2.
Figure 3B:
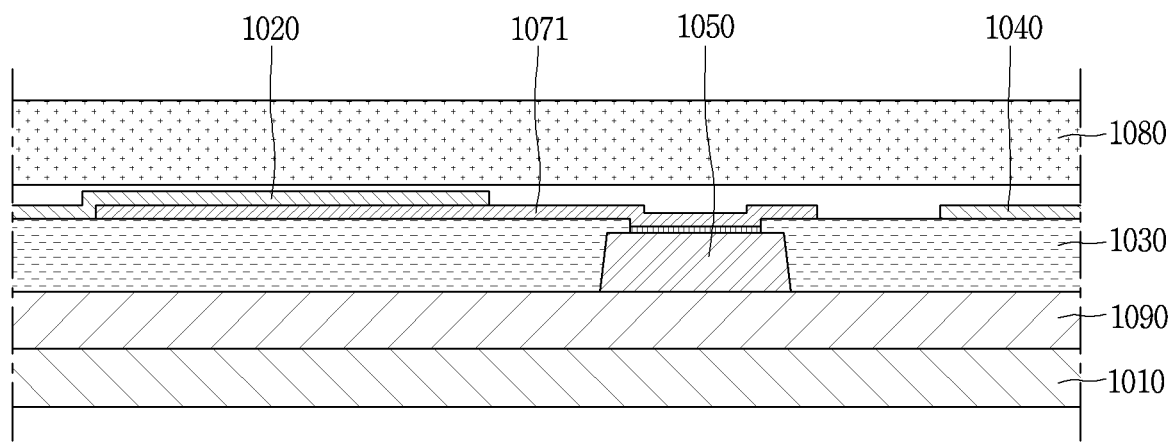
Figure 4:
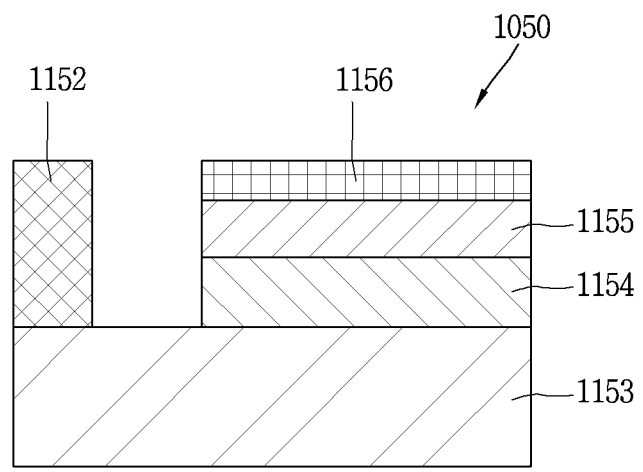
FIG. 4 is a conceptual view illustrating a horizontal type semiconductor light emitting device of FIG. 3.

FIGS. 2A and 2B are a partial enlarged view and a planar view of an area A of FIG. 1B, FIGS. 3A and 3B are sectional views taken along the lines B-B and C-C of FIG. 2, and FIG. 4 is a conceptual view illustrating a horizontal type semiconductor light emitting device of FIG. 3.

Referring to FIGS. 2A, 2B, 3A, 3B and 4, a passive matrix (PM) type semiconductor light emitting device is exemplarily used as the light source unit 100 using the semiconductor light emitting device. However, the example described hereinafter may also be applicable to an active matrix (AM) type semiconductor light emitting device.

The light source unit 1010 includes a base substrate 1010, an insulating layer 1030, a first electrode 1020, a second electrode 1040, and a plurality of semiconductor light emitting devices 1050.

The base substrate 1010 may be a base layer with a structure formed through an entire process, and may be a wiring substrate on which a reflective film 1090 is disposed. The base substrate 1010 may be formed of glass or polyimide (PI) to implement a flexible light source unit. In addition, the substrate 1010 may be made of a thin metal. The substrate 110 may alternatively be made of any material with insulating property and flexibility, for example, polyethylene naphthalate (PEN), polyethylene terephthalate (PET), and the like. In addition, the base substrate 1010 may be formed of any of a transparent material or an opaque material.

Meanwhile, a heat dissipating sheet, a heat sink, or the like may be mounted on the base substrate 1010 to realize a heat dissipating function. In this case, the heat dissipating sheet, the heat sink, or the like may be mounted on an opposite surface to a surface on which the reflective film 1090 is disposed.

The reflective film 1090 may be a reflective metal deposited on the base substrate 1010 or a mirror coated on the base substrate 1010 so as to fully cover one surface of the base substrate 1010.

The plurality of semiconductor light emitting devices 1050 may be coupled to the reflective film 1090 in a bonding manner or the like. In this case, the reflective film 1090 and the semiconductor light emitting devices may be coupled in a eutectic bonding manner or the like.

Since the semiconductor light emitting device 1050 has excellent brightness, it can constitute an individual unit pixel even though it has a small size. The individual semiconductor light emitting device 1050 may have a size of 80 μm or less on one side, and may be a rectangular or square device. In this case, an area of the single semiconductor light emitting device is in the range of 10-10 to 10-5 m2, and an interval between the light emitting devices may be in the range of 100 um to 10 mm.

Referring to FIG. 4, the semiconductor light emitting device 1050 may be a flip chip type light emitting device. However, the present invention is not limited thereto, and the semiconductor light emitting device may be a vertical type light emitting device.

Referring to FIG. 4, the horizontal type semiconductor light emitting device includes a first conductive electrode 1156, a first conductive semiconductor layer 1155 on which the first conductive electrode 1156 is disposed, an active layer 1154 disposed on the first conductive semiconductor layer 1155, a second conductive semiconductor layer 1153 disposed on the active layer 1154, and a second conductive electrode 1152 disposed on the second conductive semiconductor layer 1153 with being horizontally spaced apart from the first conductive electrode 1156. In this case, the second conductive electrode 1152 may be disposed on one surface of the second conductive semiconductor layer 1153, and an undoped semiconductor layer disposed on another surface of the second conductive semiconductor layer 1153. In addition, a passivation layer (not shown) may surround the first conductive semiconductor layer 1155, the active layer 1154, and the second conductive semiconductor layer 1153.

The first conductive electrode 1156 and the first conductive semiconductor layer 1155 may be a p-type electrode and a p-type semiconductor layer, respectively. The second conductive electrode 1152 and the second conductive semiconductor layer 1153 may be an n-type electrode and an n-type semiconductor layer, respectively. The n-type electrode and the p-type electrode may be formed by a deposition method such as sputtering, but the present invention is not limited thereto.

However, the present invention is not necessarily limited thereto, and may employ an example in which the first conductive electrode is the n-type and the second conductive electrode is the p-type. The p-type semiconductor layer may be P-type GaAs, and the n-type semiconductor layer may be N-type GaAs.

According to another embodiment of the present invention, impurities may be implanted into an intrinsic or doped semiconductor substrate to form the first and conductive semiconductor layers. In addition, a region where a p-n junction is formed by the impurity implantation may serve as the active layer. Therefore, the following description of the p-type semiconductor layer, the n-type semiconductor layer, and the active layer is merely exemplary and the present invention is not limited thereto.

The semiconductor light emitting device described above may be any one of a plurality of semiconductor light emitting devices 1050 arranged at preset intervals along a direction parallel to the first electrode 1020.

Referring back to FIGS. 2A, 2B, 3A, and 3B, a bonding layer is disposed between the second conductive semiconductor layer 1153 and the reflective film 1090, so that the second conductive semiconductor layer 1153 is directly bonded to the reflective film 1090. As another example, when the undoped semiconductor layer is formed on the another surface of the second conductive semiconductor layer 1153, the bonding layer may be disposed between the undoped semiconductor layer and the reflective film 1090, so that the undoped semiconductor layer can be directly bonded to the reflective film 1090.

According to the structure, an insulating material is filled in a space between the semiconductor light emitting devices to form the insulating layer 1030 so as to have an insulating property. For example, the insulating layer 1030 is stacked on the reflective layer 1090 and surrounds the semiconductor light emitting device 1050. In addition, the insulating layer 1030 may have flexibility and thus the light source unit is flexible.

In addition, the insulating layer 1030 may be a transparent insulating layer including silicon oxide (SiOx) or the like. As another example, the insulating layer 1030 may be made of epoxy having an excellent insulation characteristic and low light absorption, a polymer material such as methyl, phenyl-based silicone and the like, or an inorganic material such as SiN, Al2O3, and the like, in order to prevent shorting between electrodes.

As another example, the insulating layer 1030 may be replaced with an adhesive layer. In this case, the semiconductor light emitting device may be bonded to the reflective film 1090 using the adhesive property of the insulating layer 1030 without a separate bonding layer.

The first electrode 1020 and the second electrode 1040 may be disposed on an upper surface of the insulating layer 1030.

The first electrode 1020 may be disposed on the insulating layer 1030 and may be formed as an electrode in a linear shape. The first electrode 1020 may be a plurality of lines between the semiconductor light emitting devices 1050, and electrically connected to the semiconductor light emitting devices 1050.

Therefore, the first electrode 1020 may be an electrode layer disposed on an upper side of the semiconductor light emitting device 1050 and may serve as a data electrode. As described above, the first electrode 1020 may serve as a wiring of the semiconductor light emitting device 1050, and thus may be referred to as a wiring electrode.

The second electrode 1040 may be electrically connected to the semiconductor light emitting devices 1050 and may be disposed on one surface of the insulating layer 1030. The second electrode 1040 may also be a plurality of lines to serve as a scan electrode.

In this case, any one of the first electrode 1020 and the second electrode 1040 may be electrically connected to one of the p-type electrode 1156 and the n-type electrode 1152 of the semiconductor light emitting device, and another one of the first electrode 1020 and the second electrode 1040 may be connected to another one of the p-type electrode 1156 and the n-type electrode 1152. More specifically, the n-type electrode 1152 may be electrically connected to the second electrode 1040.

The second electrode 1040 may be a plurality of lines located between the semiconductor light emitting devices 1050, and electrically connected to the semiconductor light emitting devices 1050. For example, the semiconductor light emitting devices 1050 may be disposed in a plurality of rows, and the second electrode 1040 may be formed as an electrode in a bar-like shape long in one direction so as to be located between the rows of the semiconductor light emitting devices 1050. In this case, the second electrode 1040 may be located between the semiconductor light emitting devices 1050 because a distance between the semiconductor light emitting devices 1050 each forming an individual pixel is sufficiently large.

More specifically, the first electrode 1020 and the second electrode 1040 may be sequentially disposed along one direction, and one row of the semiconductor light emitting devices 1050 may be disposed between the adjacent first and second electrodes 1020 and 1040. That is, the first electrode 1020 and the second electrode 1040 are formed to be parallel to each other, and the one row of the semiconductor light emitting devices is located between the first electrode 1020 and the second electrode 1040. Hereinafter, the one row is defined as a unit light source. According to the example, a plurality of unit light sources are sequentially arranged in a column direction. That is, the first electrode 1020, the unit light source, the second electrode 1040, and the unit light source may be repeatedly arranged in the column direction.

Referring to FIG. 2B, the semiconductor light emitting devices 1050 are connected in parallel by the first electrode 1020 and the second electrode 1040. More specifically, any one of the p-type electrode and the n-type electrode included in each of the plurality of semiconductor light emitting devices 1050 within the unit light source is connected to the first electrode 1020, and another one of the p-type electrode and the n-type electrode is connected to the second electrode 1040. That is, the plurality of semiconductor light emitting devices 1050 are connected in parallel so as to have the first electrode 1020 and the second electrode 1040 facing each other as common electrodes, respectively.

Meanwhile, the unit light sources disposed on the base substrate may be connected in series. More specifically, the respective lines of the first electrode 1020 are connected to each other at the edge of the light source unit 1000, and the respective lines of the second electrode 1040 are connected to each other at the edge of the light source unit 1000.

According to the series-parallel mixed structure described above, the light source unit 1000 according to the present invention may have a structure in which the plurality of semiconductor light emitting devices are connected in parallel within each unit light source, and the unit light sources are connected in series. This may result in preventing a loss of function of an entire system due to an electrical disconnection, which is caused by presence of defective semiconductor light emitting devices, and acquiring uniform current distribution.

Meanwhile, the first and second electrodes 1020 and 1040 may be electrically connected to the semiconductor light emitting device 1050 by light-transmitting connection electrodes 1071 and 1072. The light-transmitting connection electrodes 1071 and 1072 extend from the first electrode 1020 and the second electrode 1040, respectively, to be electrically connected to the semiconductor light emitting device and cover an upper surface of the semiconductor light emitting device. In this case, the light-transmitting connection electrodes 1071 and 1072 may be provided with transparent electrodes such as ITO (Indium Tin Oxide). For example, the light-transmitting connection electrodes 1071 and 1072 may include a first connection electrode 1071 and a second connection electrode 1072. The first connection electrode 1071 may connect the first electrode 1020 to the first conductive electrode 1156 of the semiconductor light emitting device and the second connection electrode 1072 may connect the second electrode 1040 to the second conductive electrode 1152 of the semiconductor light emitting device.

However, the present invention is not necessarily limited to this. For example, the first connection electrode 1071 may serve as the first conductive electrode so as to be the p-type electrode of the semiconductor light emitting device 1050. The second connection electrode 1072 may also serve as the second conductive electrode so as to be the n-type electrode of the semiconductor light emitting device 1050.

Referring to FIG. 3, the insulating layer 1030 may cover the semiconductor light emitting device. The insulating layer 1030 may be provided with an open hole 1031 to expose the upper surface of the semiconductor light emitting device. The light-transmitting connection electrodes 1071 and 1072 may extend to the upper surface of the semiconductor light emitting device through the open hole 1031. In this case, the light-transmitting connection electrodes 1071 and 1072 may be electrically connected to the first conductive electrode and the second conductive electrode through the open hole 1031. That is, the first connection electrode 1071 and the second connection electrode 1072 are formed to cover the insulation layer 1030, the open hole 1031, and the semiconductor light emitting device 1050 to form an electric connection path.

At this time, the light-transmitting connection electrodes 1071 and 1072 may protrude in opposite directions from the first electrode 1020 and the second electrode 1040. As a more detailed example, the first conductive electrode 1156 and the second conductive electrode 1152 of the semiconductor light emitting device may be spaced from each other along the row direction of the semiconductor light emitting device. The first connection electrode 1071 may protrude from the first electrode 1020 toward the first conductive electrode 1156, and the second connection electrode 1072 may protrude from the second electrode 1040 toward the second conductive electrode 1152.

Meanwhile, the light source unit 1000 may include a phosphor layer 1080. The phosphor layer 1080 is disposed on the upper side of the plurality of semiconductor light emitting devices 1050 to change wavelengths of light.

For example, the semiconductor light emitting device 1050 may be a blue semiconductor light emitting device that emits blue (B) light, and the phosphor layer 1080 may be provided to convert (change) the blue (B) light into another color of light.

In this case, the phosphor layer 1080 may include one of a red phosphor capable of converting blue light into red (R) light, a green phosphor capable of converting blue light into green (G) light, and a yellow phosphor capable of converting blue light into white (W) light. As another example, the phosphor layer 1080 may include all of the red phosphor and the green phosphor to mix light of various wavelengths so as to realize white light.

Since this embodiment exemplarily shows the rear lamp 100 that outputs red light, the phosphor layer 1080 includes the red phosphor. However, the present invention is not necessarily limited thereto. When a GaAs-based red semiconductor light emitting device is used, a light diffusion film other than a phosphor may be used for the phosphor layer 1080. In addition, a patterned sheet may be inserted in an upper portion or a lower portion of the phosphor layer 1080 to improve light extraction efficiency.

At this time, a color filter (not illustrated) may also be stacked on the phosphor layer 1080 to improve color purity of converted light. In this case, the color filter may be a filter that transmits only a red wavelength and filters the other colors of wavelengths.

In addition, a protective layer may cover the color filter to protect the light source unit 1000 from moisture, oxygen, and external impact. At this time, the protective layer may be formed by bonding a film or coating resin.

According to the structure described above, the vehicle lamp according to the present invention realizes a vehicle lamp of a point light source having high brightness through such a new type of stacking structure.

On the other hand, the new type of stacking structure may be modified into various forms to further increase brightness or optimize a resistance value of an individual chip end. These modifications will be described below.

Figure 5A:
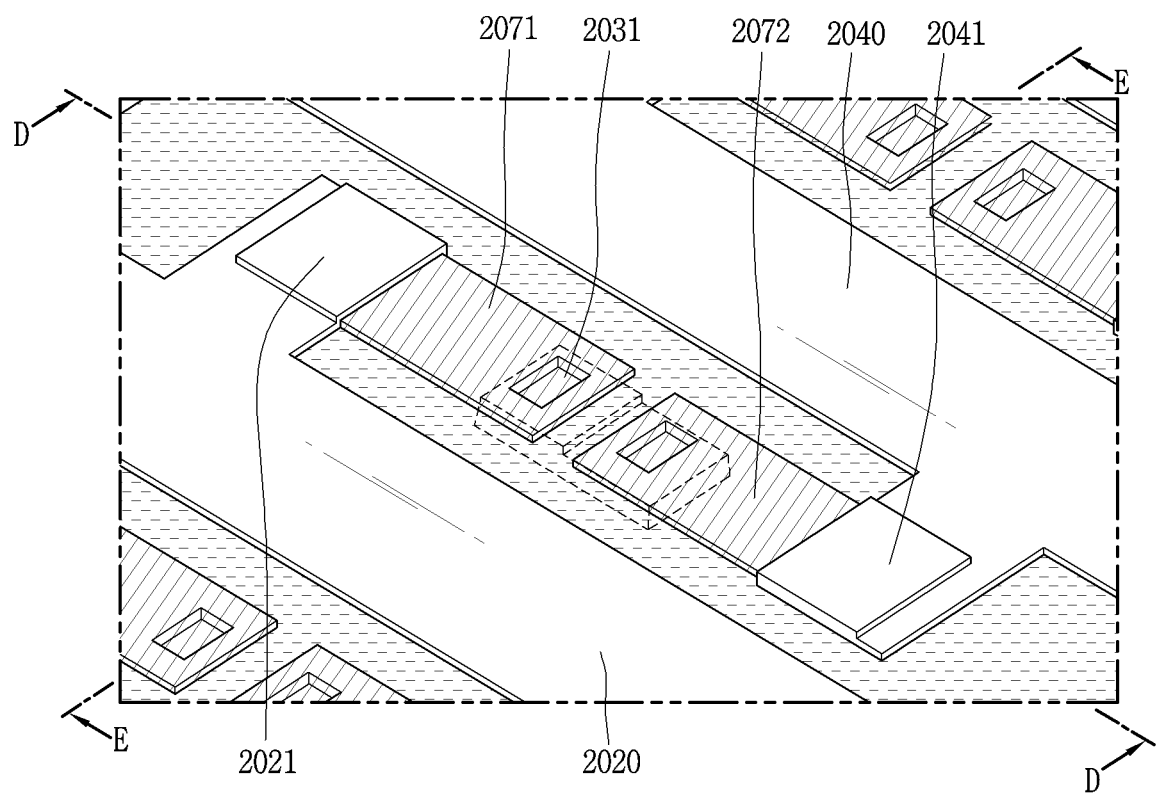
FIGS. 5A and 5B are an enlarged view and a planar view illustrating another embodiment of a light source unit of the present invention.
Figure 5B:
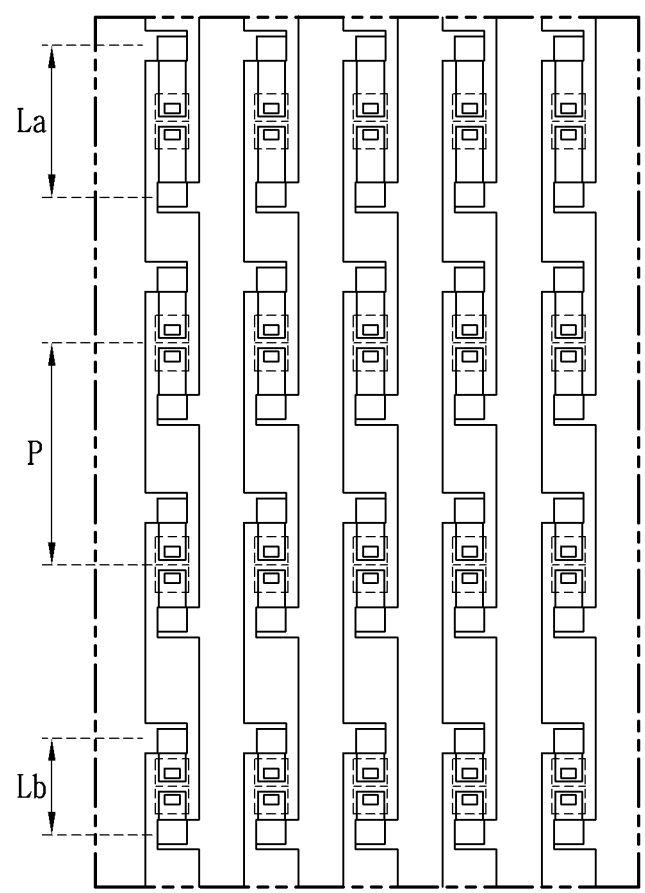
Figure 5C:
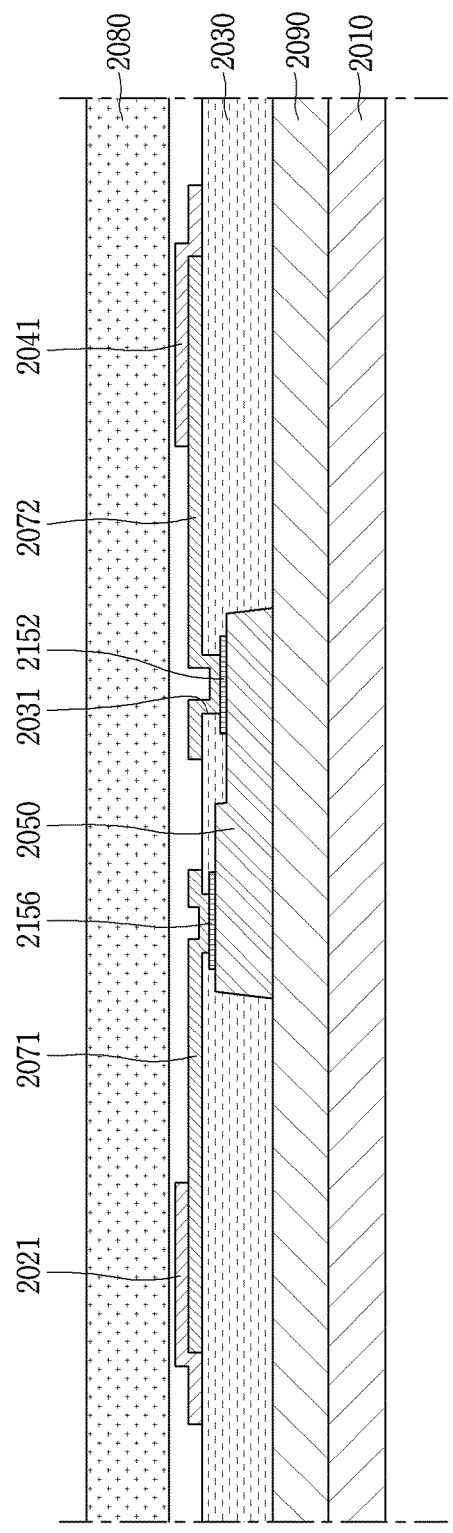
FIGS. 5C and 5D are sectional views taken along the lines D-D and E-E of FIG. 5A.
Figure 5D:
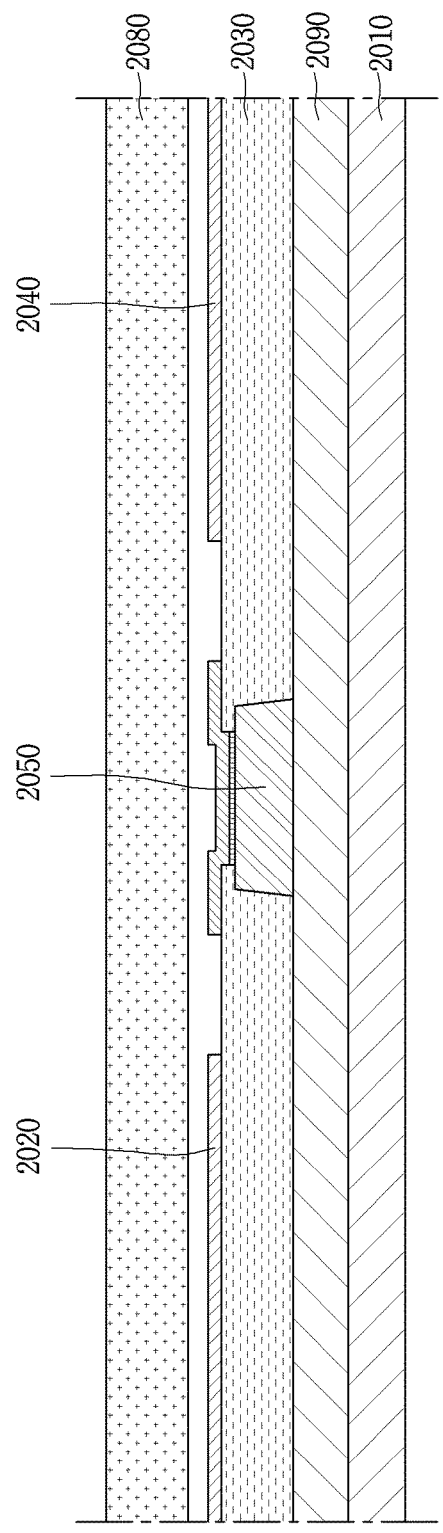

FIGS. 5A and 5B are an enlarged view and a planar view illustrating another embodiment of a light source unit of the present invention, and FIGS. 5C and 5D are sectional views taken along the lines D-D and E-E of FIG. 5A.

Referring to FIGS. 5A to 5D, a connecting direction of the light-transmitting connection electrodes is changed, and a branch is provided on a metal wiring to optimize a resistance value of an individual chip end. In this case, a light source unit of a rear lamp includes, similar to the foregoing embodiment, a base substrate 2010, an insulating layer 2030, a first electrode 2020, a second electrode 2040, light-transmitting connection electrodes 2071 and 2072, a plurality of semiconductor light emitting devices 2050, and a phosphor layer 2080. In this case, a structure except for the first electrode 2020, the second electrode 2040, and the light-transmitting connection electrode may have the same structure as that of the foregoing embodiment, and therefore, description thereof will be replaced with the description given with reference to FIGS. 2A to 4.

Referring to the drawings, the first electrode 2020 and the second electrode 2040 may be disposed on an upper surface of the insulating layer 2030.

The first electrode 2020 may be disposed on the insulating layer 2030 and may be formed as an electrode in a linear shape. The first electrode 2020 may be a plurality of lines between the semiconductor light emitting devices 2050, and electrically connected to the semiconductor light emitting devices 2050.

Therefore, the first electrode 2020 may be an electrode layer disposed on an upper side of the semiconductor light emitting device and may serve as a data electrode. In this manner, the first electrode 2020 may be a wiring of the semiconductor light emitting device, and thus referred to as a wiring electrode.

The second electrode 2040 may be electrically connected to the semiconductor light emitting devices 2050 and may be disposed on one surface of the insulating layer 2030. The second electrode 2040 may also be a plurality of lines to serve as a scan electrode.

In this case, any one of the first electrode 2020 and the second electrode 2040 may be electrically connected to one of the p-type electrode 2156 and the n-type electrode 2152 of the semiconductor light emitting devices, and another one of the first electrode 2020 and the second electrode 2040 may be connected to another one of the p-type electrode 2156 and the n-type electrode 2152. More specifically, the n-type electrode 2152 may be electrically connected to the second electrode 2040.

The second electrode 2040 may be a plurality of lines located between the semiconductor light emitting devices 2050, and electrically connected to the semiconductor light emitting devices 2050. For example, the semiconductor light emitting devices 2050 may be disposed in a plurality of rows, and the second electrode 2040 may be formed as an electrode in a bar-like shape long in one direction so as to be located between the rows of the semiconductor light emitting devices 2050. In this case, the second electrode 2040 may be located between the semiconductor light emitting devices 2050 because a distance between the semiconductor light emitting devices 2050 each forming an individual pixel is sufficiently large.

Similar to the foregoing example, the first electrode 2020 and the second electrode 2040 are formed to be parallel to each other and the unit light source of the semiconductor light emitting device 2050 is disposed between the first electrode 2020 and the second electrode 2040. In this case, the semiconductor light emitting devices 2050 are connected in parallel by the first electrode 2020 and the second electrode 2040. More specifically, any one of the p-type electrode and the n-type electrode included in each of the plurality of semiconductor light emitting devices 2050 within the unit light source is connected to the first electrode 2020, and another one of the p-type electrode and the n-type electrode is connected to the second electrode 2040. That is, the plurality of light emitting devices are connected in parallel so as to have the first electrode 2020 and the second electrode 2040 facing each other as common electrodes, respectively. In addition, the unit light sources disposed on the base substrate may be connected in series. More specifically, the respective lines of the first electrode 2020 may be connected in series at the edge of the light source unit, and the respective lines of the second electrode 2040 may be connected in series at the edge of the light source unit.

On the other hand, the first electrode 2020 and the second electrode 2040 may respectively include a first protrusion 2021 and a second protrusion 2041 protruding in opposite directions from each other. The first protrusion 2021 and the second protrusion 2041 are branches of the first electrode 2020 and the second electrode 2040, respectively, and protrude from sides of the first electrode 2020 and the second electrode 2040 which face each other. At this time, the first protrusion 2021 and the second protrusion 2041 may protrude from crossing positions in a manner of creating a space therebetween. The semiconductor light emitting device is thus disposed in the space between the first protrusion 2021 and the second protrusion 2041.

Meanwhile, the first and second protrusions 2021 and 2041 may be electrically connected to the semiconductor light emitting device 2050 by the light-transmitting connection electrodes 2071 and 2072. The light-transmitting connection electrodes 2071 and 2072 extend from the first protrusion 2021 and the second protrusion 2041 toward the semiconductor light emitting device 2050, respectively, to be electrically connected to the semiconductor light emitting device 2050, and cover the upper surface of the semiconductor light emitting device 2050. At this time, the light-transmitting connection electrodes 2071 and 2072 may protrude from the first protrusion 2021 and the second protrusion 2041 in opposite directions to each other.

In this case, the light-transmitting connection electrodes 2071 and 2072 may be provided with transparent electrodes such as ITO (Indium Tin Oxide). For example, the light-transmitting connection electrodes 2071 and 2072 may include a first connection electrode 2071 and a second connection electrode 2072. The first connection electrode 2071 may connect the first electrode 2020 to the first conductive electrode 2156 of the semiconductor light emitting device and the second connection electrode 2072 may connect the second electrode 2040 to the second conductive electrode 2152 of the semiconductor light emitting device. Since the semiconductor light emitting device 2050 is disposed between the first protrusion 2021 and the second protrusion 2041, the light-transmitting connection electrodes 2071 and 2072 may be disposed in parallel to the first electrode 202 and the second electrode 2040 so as to be electrically connected to the first conductive electrode 2156 and the second conductive electrode 2152.

However, the present invention is not necessarily limited thereto. For example, the first connection electrode 2071 may serve as the first conductive electrode, so as to be the p-type electrode 2156 of the semiconductor light emitting device 2050. The second connective electrode 2072 may serve as the second conductive electrode, so as to be the n-type electrode 2152 of the semiconductor light emitting device 2050.

Referring to FIG. 3, the insulating layer 2030 may cover the semiconductor light emitting device. The insulating layer 2030 may be provided with an open hole 2031 to expose the upper surface of the semiconductor light emitting device. The light-transmitting connection electrodes 2071 and 2072 may extend to the upper surface of the semiconductor light emitting device through the open hole 2031. In this case, the light-transmitting connection electrodes 2071 and 2072 may be electrically connected to the first conductive electrode 2156 and the second conductive electrode 2152 through the open hole 2031. That is, the first connection electrode 2071 and the second connection electrode 2072 are formed to cover the insulation layer 2030, the open hole 2031, and the semiconductor light emitting device 2050 to form an electric connection path.

On the other hand, referring to FIG. 5B, the light-transmitting connection electrodes 2071 and 2072 may have different lengths depending on the positions of the plurality of semiconductor light emitting devices. The light-transmitting connection electrodes 2071 and 2072 as auxiliary wirings have such variable lengths and thus enable adjustment of input resistance. Although the plurality of semiconductor light emitting devices are arranged at preset intervals P, the lengths of the light-transmitting connection electrodes may be varied by adjusting protruded positions of the protrusions.

Therefore, a resistance value of an individual chip end can be optimized. As an example, the light-transmitting connection electrodes may have short lengths at a central portion of the unit light source and have longer lengths at an edge portion of the unit light source. More specifically, a distance Lb between the protrusions at a side close to the central portion may be shorter than a distance La between the protrusions at a side close to the edge portion.

According to the structure described above, the resistance value of the individual chip end can be optimized so as to implement a light source unit capable of ensuring uniformity of output light.

As described above, this embodiment illustrates the structure capable of ensuring the light uniformity, but the structure of the present invention may be modified into a form by which brightness can be more increased. Hereinafter, such a structure will be described in more detail.

Figure 6A:
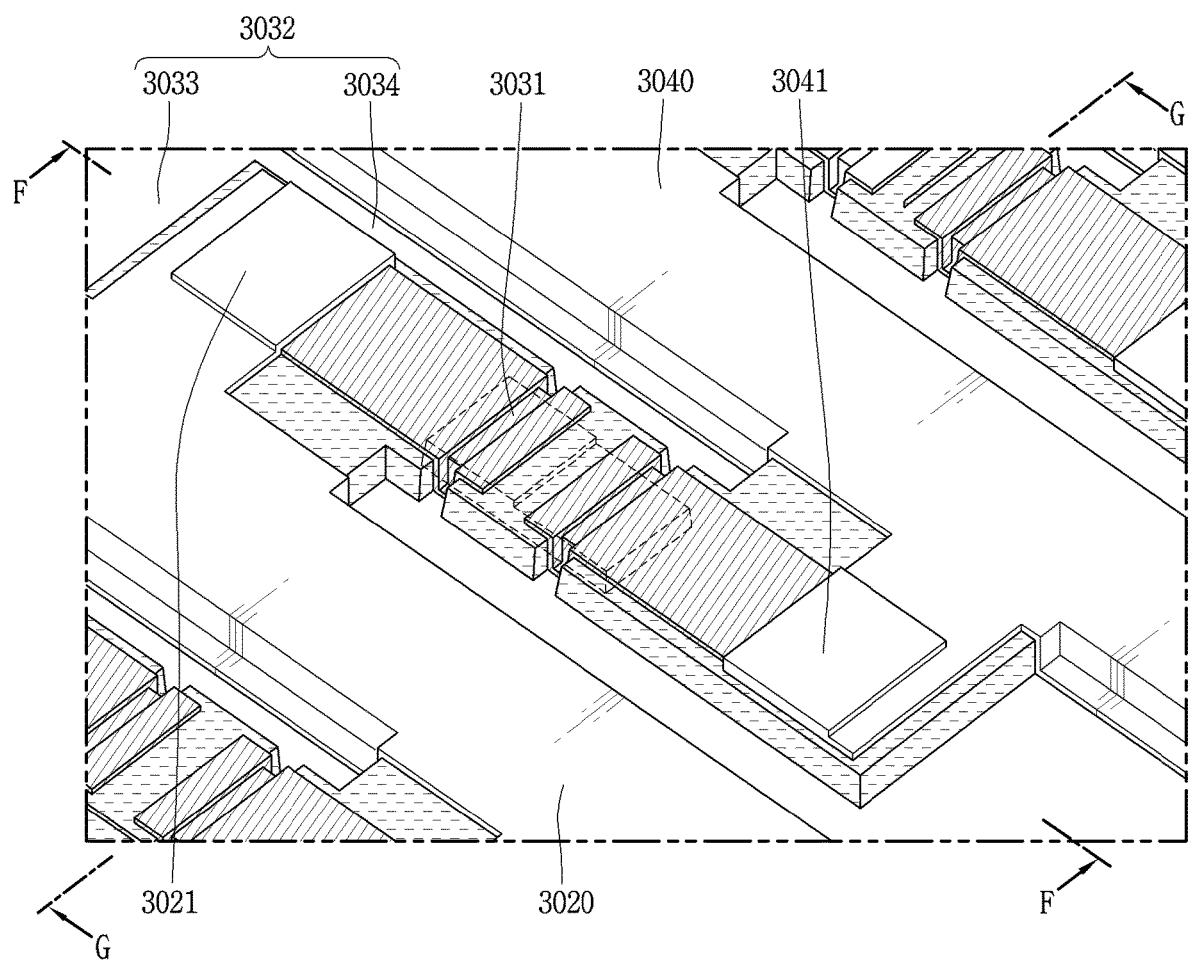
FIG. 6A is an enlarged view illustrating still another embodiment of a light source unit of the present invention.

FIG. 6A is an enlarged view illustrating still another embodiment of a light source unit of the present invention, and FIGS. 6B and 6C are sectional views taken along the lines F-F and G-G of FIG. 6A.

Referring to FIGS. 6A to 6C, a structure is disclosed in which an insulating layer 3030 is opened to increase brightness of a light source unit.

In this case, a light source unit of a rear lamp includes, similar to the foregoing embodiment, a base substrate 3010, an insulating layer 3030, a first electrode 3020, a second electrode 3040, light-transmitting connection electrodes 3071 and 3072, a plurality of semiconductor light emitting devices 3050, and a phosphor layer 3080. In this case, a structure except for the insulating layer 3030 and light-transmitting connection electrodes 3071 and 3072 may be the same structure as that of the foregoing embodiment, and therefore, the description thereof will be replaced with reference to FIGS. 5A to 5C.

As illustrated in those drawings, the insulating layer 3030 is formed to fill a space between the semiconductor light emitting devices and has an insulating property. For example, the insulating layer 3030 is stacked on a reflective film 3090 provided on the base substrate and surrounds the semiconductor light emitting device. In addition, the insulating layer 3030 may have flexibility, and thus the light source unit is flexible.

In addition, the insulating layer 3030 may be a transparent insulating layer including silicon oxide (SiOx) or the like. As another example, the insulating layer 1030 may be formed of epoxy having excellent insulation characteristic and low light adsorption, a polymer material such as methyl, phenyl-based silicone and the like, or an inorganic material such as SiN, Al2O3 and the like, in order to prevent shorting between electrodes.

As another example, the insulating layer 3030 may be replaced with an adhesive layer. In this case, the semiconductor light emitting device may be coupled to the reflective film using an adhesive property of the insulating layer without a separate bonding layer.

The first electrode 3020 and the second electrode 3040 may be disposed on an upper surface of the insulating layer 3030. In this case, the first electrode 3020 and the second electrode 3040 are provided with a first protrusion and a second protrusion, respectively, and the structure of the electrodes and the protrusions is the same as the foregoing structure described with reference to FIGS. 5A to 5C, so description thereof will be omitted.

In this embodiment, the insulating layer 3030 is provided with an exposure groove 3032 to expose the reflective film 3090. As illustrated, the insulating layer 3030 may be etched down to the reflective film 3090, except for a portion of the insulating layer 3030, which surrounds the semiconductor light emitting device between the first electrode 3020 and the second electrode 3040. In this case, one surface of the reflective film 3090 is disposed on a bottom of the exposure groove 3032. Thus, four surfaces of the insulating layer 3030 may be opened with respect to side surfaces of the semiconductor light emitting device.

The insulating layer 3030 may cover the semiconductor light emitting device 3050 and may be provided with an open hole 3031 to expose the upper surface of the semiconductor light emitting device 3050. The light-transmitting connection electrodes 3071 and 3072 may extend to the upper surface of the semiconductor light emitting device 3050 through the open hole 3031. In this case, the light-transmitting connection electrodes 3071 and 3072 may be electrically connected to the first conductive electrode 3156 and the second conductive electrode 3152 through the open hole 3031. That is, the first connection electrode 3071 and the second connection electrode 3072 are formed to cover the insulation layer 3030, the open hole 3031, and the semiconductor light emitting device 3050 so as to form an electric connection path.

Figure 7A:
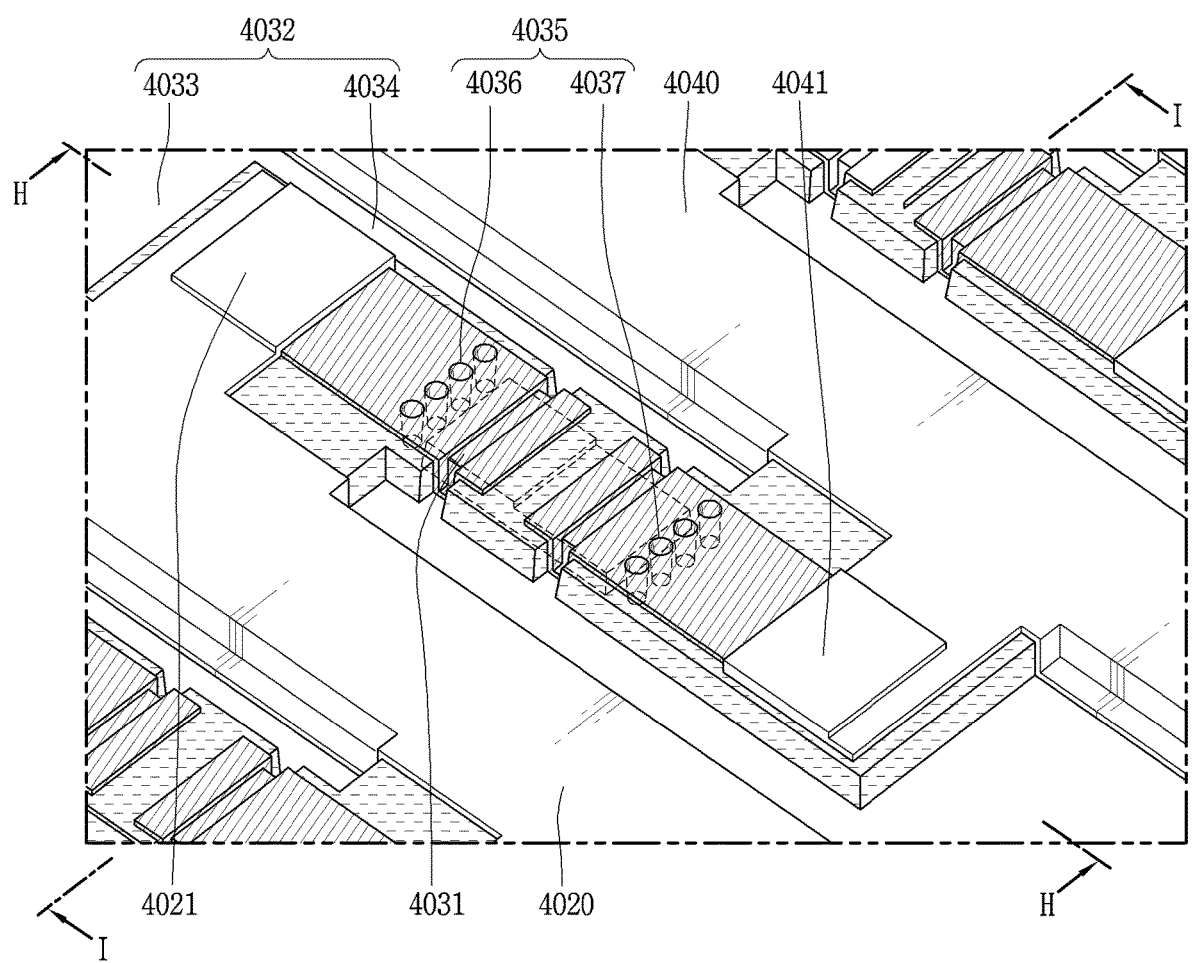
FIG. 7A is an enlarged view illustrating still another embodiment of a light source unit of the present invention.
Figure 7B:
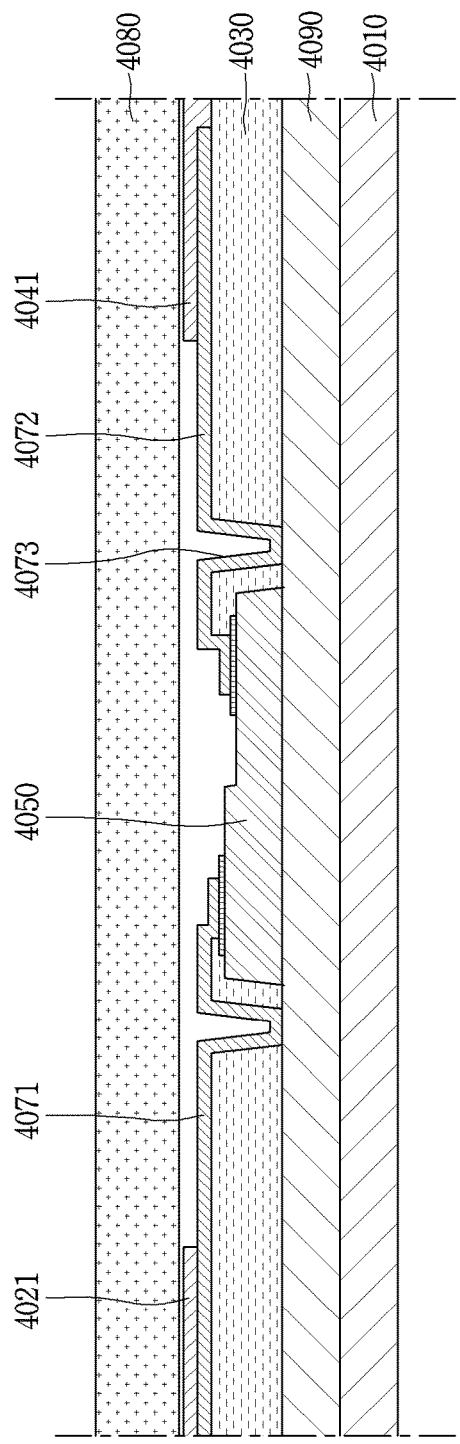
FIGS. 7B and 7C are sectional views taken along the lines H-H and I-I of FIG. 7A.
Figure 7C:
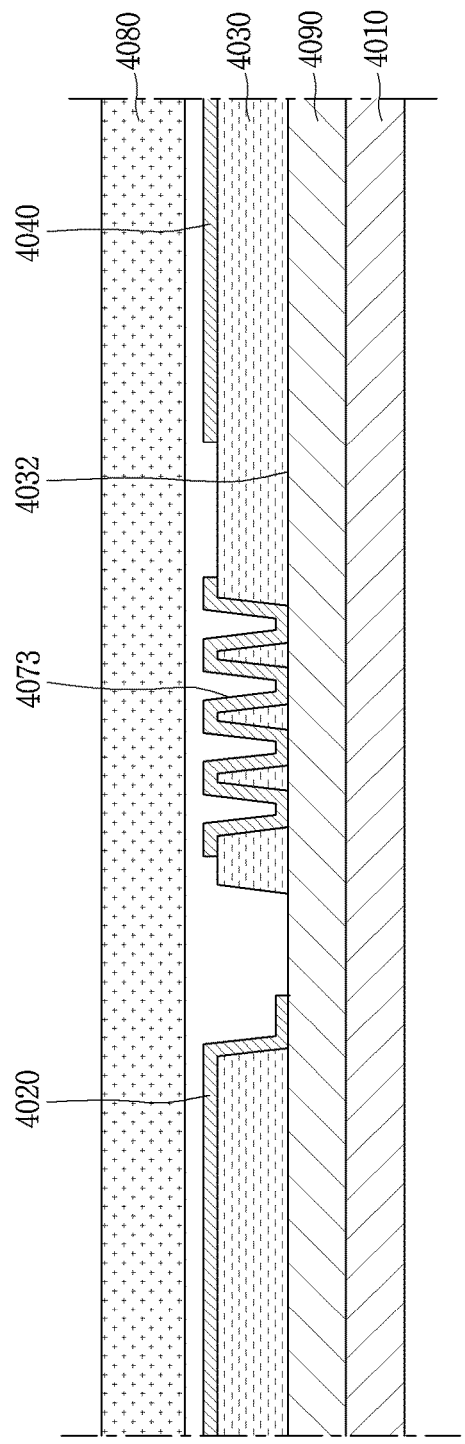

In this case, at least part of the insulating layer 3030 may be formed to cover the upper surface of the semiconductor light emitting device, and the open hole 3031 may be formed through the at least part of the insulating layer 3030 covering the upper surface. The open hole 3031 may extend up to the exposure groove 3032 in a lateral direction to communicate with the exposure groove 3032. According to the structure, the at least part of the insulating layer covering the upper surface may be formed at the edge and the center of the semiconductor light emitting device, respectively, and the open hole 3031 may be disposed between the edge and the center. As another example, as illustrated in FIGS. 7A to 7C to be explained later, a configuration in which the insulating layer is not formed at the center of the semiconductor light emitting device may also be implemented.

The exposure groove 3032 may extend in a direction parallel to the first electrode 3020 and the second electrode 3040. As illustrated in the drawings, the exposure groove 3032 may be formed to be long between the semiconductor light emitting devices 3050 along the row direction.

The exposure groove 3032 may include a first portion 3033 formed between the first electrode 3020 and the second electrode 3040, and a second portion 3032 protruding from the first portion 3033 to extend between the semiconductor light emitting device and one of the first electrode 3020 and the second electrode 3040.

The first portion 3033 is a portion where the first electrode 3020 and the second electrode 3040 are disposed on both sides and is formed symmetrically with respect to the semiconductor light emitting device. The second portion 3034 may be a portion where one of the first electrode 3033 or the second electrode 3034 and the semiconductor light emitting device are disposed on both sides.

However, the present invention is not necessarily limited to this example. For example, the exposure groove may have only the first portion without the second portion. In this case, two surfaces of the insulating layer may be opened with respect to the side surfaces of the semiconductor light emitting device.

As illustrated, at least one of the first electrode 3020 and the second electrode 3040 is formed to cover a side wall of the exposure groove 3032. At least one of the first electrode 3020 and the second electrode 3040 extends from the side wall of the exposure groove 3032 to the upper surface of the reflective film 3090. In this example, the first electrode 3020 covers one side wall of the exposure groove 3032, and the second electrode 3040 covers another side wall of the exposure groove 3032. The first electrode 3020 and the second electrode 3040 may be bent at the side walls of the exposure groove 3032 so as to cover at least part of a bottom of the exposure groove 3032, respectively. In this case, the first electrode 3020 and the second electrode 3040 serve as a reflective layer.

According to the structure described above, the insulating layer may have a structure of opening the lateral direction of the semiconductor light emitting device, so as to ensure more increased brightness.

As another example, a light extraction pattern may also be provided on a light-transmitting connection electrode to reduce light absorption by a metal wiring. Hereinafter, the light source unit having the light extraction pattern will be described in more detail.

FIG. 7A is an enlarged view illustrating another embodiment of a light source unit of the present invention, and FIGS. 7B and 7C are sectional views taken along the lines H-H and I-I of FIG. 7A.

As illustrated in FIGS. 7A to 7C, a structure having a through hole in an insulating layer to form a light extracting pattern is disclosed.

In this case, a light source unit of a rear lamp, similar to the foregoing embodiment, includes a base substrate 4010, an insulating layer 4030, a first electrode 4020, a second electrode 4040, light-transmitting connection electrodes 4071 and 4072, a plurality of semiconductor light emitting devices 4050, and a phosphor layer 4080.

This embodiment exemplarily illustrates that the insulating layer 4030 is provided with an exposure groove 4031 to expose the reflective film 4090 but may also be applied to a case where the exposure groove 4031 is not provided. In this case, a structure except for the insulating layer 4030 and the light-transmitting connection electrodes 4071 and 4072 may be the same structure as the foregoing embodiment, and therefore, description thereof will be replaced with the description given with reference to FIGS. 6A to 6C.

According to the structure, the insulating layer 4030 may further be provided with a plurality of through holes 4035 penetrating therethrough up to the reflective film 4090. The structure of the insulating layer 4030 excluding the through holes 4035 may be any one of the embodiments described above with reference to FIGS. 2A to 6C, so description thereof will be omitted.

The plurality of through holes 4035 may be sequentially disposed along a direction intersecting with the first electrode 4020 and the second electrode 4040. For example, first through holes 4036 may be disposed adjacent to one end of the semiconductor light emitting device 4050, and second through holes 4037 may be disposed adjacent to another end thereof. The first through holes 4036 and the second through holes 4037 may be arranged at preset intervals, respectively, along a direction perpendicular to the first electrode 4020.

The insulating layer 4030 may cover the semiconductor light emitting device 4050. The insulating layer 4030 may be provided with an open hole 4031 to expose the upper surface of the semiconductor light emitting device 4050. The light-transmitting connection electrodes 4071 and 4072 may extend to the upper surface of the semiconductor light emitting device 4050 through the open hole 4031. In this case, the light-transmitting connection electrodes 4071 and 4072 may be electrically connected to the first conductive electrode 4156 and the second conductive electrode 4152 through the open hole 4031. That is, the first connection electrode 4071 and the second connection electrode 4072 cover the insulation layer 4030, the open hole 4031, and the semiconductor light emitting device 4050 so as to form an electric connection path.

In this case, the plurality of through holes 4036 and 4037 may be disposed adjacent to both sides of the open hole 4031. For example, the first through holes 4036 are disposed between one side of the open hole 4031 and the first protrusion 4021 of the first electrode 4020, and the second through holes 4037 are disposed between another side of the open hole 4031 and the second protrusion 4041 of the second electrode 4040. According to this structure, the light-transmitting connection electrodes 4071 and 4072 cover the plurality of through holes 4036 and 4037. More specifically, the light-transmitting connection electrodes 4071 and 4072 may be inserted into the plurality of through holes 4036 and 4037. The light-transmitting connection electrodes 4071 and 4072 have a concave-convex shape 4073 by covering the side walls of the through holes and one surface of the reflective film. With this structure, an open area of the reflective film 4090 can be more increased.

According to the structure described above, an additional pattern may be formed on the insulating layer in a wiring direction, thereby more enhancing brightness.

The aforementioned vehicle lamp using the semiconductor light emitting device are not limited to the configuration and the method of the embodiments described above, but the embodiments may be configured such that all or some of the embodiments are selectively combined so that various modifications can be made.

What is claimed is:

1. A vehicle lamp provided with a light source unit to emit light,
    wherein the light source unit comprises:
    a substrate having a reflective film;
    a semiconductor light emitting device coupled to the substrate;
    an insulating layer stacked on the reflective film to surround the semiconductor light emitting device;
    a first electrode and a second electrode disposed on an upper surface of the insulating layer; and
    light-transmitting connection electrodes extending from the first and second electrodes, respectively, and electrically connected to the semiconductor light-emitting device, the light-transmitting connection electrodes covering an upper surface of the semiconductor light-emitting device,
    wherein the insulating layer is provided with an exposure groove to expose the reflective film therethrough,
    wherein the exposure groove extends in a direction parallel to the first electrode and the second electrode, and
    wherein the exposure groove is provided with a first portion formed between the first electrode and the second electrode, and a second portion protruding from the first portion and extending between the semiconductor light emitting device and one of the first electrode and the second electrode.

2. The vehicle lamp of claim 1, wherein at least one of the first electrode and the second electrode is disposed to cover a side wall of the exposure groove.

3. The vehicle lamp of claim 2, wherein at least one of the first electrode and the second electrode extends from the side wall of the exposure groove to the upper surface of the reflective film.

4. The vehicle lamp of claim 1, wherein the insulating layer is further provided with a plurality of through holes penetrating therethrough up to the reflective film.

5. The vehicle lamp of claim 4, wherein the light-transmitting connection electrodes are inserted into the plurality of through holes.

6. The vehicle lamp of claim 4, wherein the plurality of through holes are sequentially disposed along a direction intersecting with the first electrode and the second electrode.

7. The vehicle lamp of claim 1, wherein at least part of the insulating layer covers the upper surface of the semiconductor light emitting device.

8. The vehicle lamp of claim 1, wherein the first portion and the second portion are formed in the insulating layer to expose the reflective film therethrough.

9. The vehicle lamp of claim 1, further comprising a plurality of semiconductor light emitting devices that are arranged and connected along length directions of the first and second electrode lines.

* * * * *